United States Patent
Ro et al.

(10) Patent No.: US 11,276,452 B2
(45) Date of Patent: Mar. 15, 2022

(54) MEMORY DEVICE INCLUDING A PLURALITY OF AREA HAVING DIFFERENT REFRESH PERIODS, MEMORY CONTROLLER CONTROLLING THE SAME AND MEMORY SYSTEM INCLUDING THE SAME

(71) Applicants: SK hynix Inc., Icheon (KR); INDUSTRY-ACADEMIC COOPERATION FOUNDATION, YONSEI UNIVERSITY, Seoul (KR)

(72) Inventors: Won Woo Ro, Seoul (KR); Hyunwuk Lee, Seoul (KR); Gun Ko, Gunpo (KR); Ipoom Jeong, Seoul (KR); Min Seong Kim, Icheon (KR); Yong Tag Song, Icheon (KR); Sung Jae Lee, Icheon (KR)

(73) Assignees: SK hynix Inc., Icheon (KR); INDUSTRY-ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 0 days.

(21) Appl. No.: 16/988,478

(22) Filed: Aug. 7, 2020

(65) Prior Publication Data
US 2021/0319824 A1   Oct. 14, 2021

(30) Foreign Application Priority Data
Apr. 14, 2020   (KR) .................. 10-2020-0045023

(51) Int. Cl.
*G06N 3/04*   (2006.01)
*G11C 11/406*   (2006.01)
(Continued)

(52) U.S. Cl.
CPC .............. *G11C 11/406* (2013.01); *G06N 3/04* (2013.01); *G11C 11/4085* (2013.01); *G11C 11/4094* (2013.01)

(58) Field of Classification Search
CPC .............. G11C 11/406; G11C 11/4085; G11C 11/4094; G06N 3/04
(Continued)

(56) References Cited

U.S. PATENT DOCUMENTS

| | | | | |
|---|---|---|---|---|
| 2001/0046167 A1* | 11/2001 | Ayukawa | ............ | G11C 11/4076 365/200 |
| 2003/0169635 A1* | 9/2003 | Kim | ...................... | G11C 11/406 365/222 |

(Continued)

FOREIGN PATENT DOCUMENTS

| | | |
|---|---|---|
| KR | 1020170107559 A | 9/2017 |
| KR | 1020180069177 A | 6/2018 |

OTHER PUBLICATIONS

M. Rhu, "vDNN: Virtualized Deep Neural Networks for Scalable, Memory-Efficient Neural Network Design," in MICRO, Jul. 2016.
(Continued)

*Primary Examiner* — Ly D Pham

(57) ABSTRACT

A memory system includes a memory device including a first area being refreshed according to a first refresh period and a second area begin refreshed according to a second refresh period longer than the first refresh period. The memory system also includes a memory controller configured to generate a write command and a write data corresponding to a first write request and a first data.

4 Claims, 5 Drawing Sheets

(51) Int. Cl.
*G11C 11/408* (2006.01)
*G11C 11/4094* (2006.01)

(58) Field of Classification Search
USPC .......................................................... 711/106
See application file for complete search history.

(56) References Cited

U.S. PATENT DOCUMENTS

2013/0185609 A1* 7/2013 Park .................... G06F 11/0751
714/746
2015/0134897 A1* 5/2015 Sriramagiri ....... G11C 11/40615
711/106
2020/0327928 A1* 10/2020 Kim ................. G11C 29/50016
2020/0341840 A1* 10/2020 Chang ................. G06F 11/1044

OTHER PUBLICATIONS

B. Ishwar, "DRAM refresh mechanisms, penalties, and trade-offs," in IEEE Transactions on Computers, 2015.
L. Song, et al., "Flikker: Saving DRAM Refresh-power through Critical Data Partitioning," in ASPLOS, 2011.
J. Patrick, et al., "Proteus: Exploiting Precision Variability in Deep Neural Networks," in Parallel Computing, 2017.
T. Fengbin, et al., "RANA: Towards Efficient Neural Acceleration with Refresh-Optimized Embedded DRAM", in ISCA, 2018.

* cited by examiner

MEMORY DEVICE INCLUDING A PLURALITY OF AREA HAVING DIFFERENT REFRESH PERIODS, MEMORY CONTROLLER CONTROLLING THE SAME AND MEMORY SYSTEM INCLUDING THE SAME

CROSS-REFERENCE TO RELATED APPLICATION

The present application claims priority under 35 U.S.C. § 119(a) to Korean Patent Application No. 10-2020-0045023, filed on Apr. 14, 2020, which is incorporated herein by reference in its entirety.

BACKGROUND

1. Technical Field

Various embodiments generally relate to a memory device including a plurality of areas having respective refresh periods, a memory controller controlling the memory device and a memory system including the memory device and the memory controller.

2. Related Art

Dynamic Random Access Memory (DRAM) requires periodic refresh operations to ensure data integrity.

In case of a commercial DRAM, a refresh operation may be performed every 7.8 µs in consideration of the data retention time. Because of the refresh operation of the DRAM, delays may occur in the read or write operations and an undesired amount of energy may be consumed.

Moreover, as density and/or capacity of the DRAM increases, the ratio of power consumption due to the refresh operation to the total power consumption increases in proportion to the density and/or capacity. For example, in a 64 Gb DRAM, power consumption due to refresh operation is expected to occupy as much as 50% of the total power consumption.

Recently, as the complexity of programs using a neural network increases, demand for memory having a large capacity is also increasing. To achieve higher accuracy, the latest neural networks may have a structure including multiple layers, and accordingly, the amount of data used in the neural network operation increases, which results in higher memory usage.

As the memory usage increases, the power consumption of the memory device may become a significant portion of the total power consumption of a system during the execution of the neural network program.

Accordingly, a technique for reducing power consumption in a memory device without significantly deteriorating the accuracy of neural network operations is desired.

SUMMARY

In accordance with an embodiment of the present disclosure, a memory system includes a memory device including a first area being refreshed according to a first refresh period and a second area begin refreshed according to a second refresh period longer than the first refresh period; and a memory controller configured to generate a write command and a write data corresponding to a first write request and first data.

In accordance with an embodiment of the present disclosure, a memory device includes a cell area including a first area being refreshed according to a first refresh period and a second area being refreshed according to a second refresh period longer than the first refresh period; a command decoder configured to decode an input command; an address decoder configured to decode an input address; and a data buffer configured to store input data, wherein when the input command is a write command, the command decoder controls the cell area so that a first part of data stored in the data buffer is stored in the first area and a second part of the data stored in the data buffer is stored in the second area.

In accordance with an embodiment of the present disclosure, a memory controller includes a request queue storing a plurality of requests including a first write request; a request conversion circuit configured to convert the first write request into a plurality of split requests including a 11th write request and a 12th write request when the first write request is output from the request queue; a command generator configured to generate a plurality of split commands corresponding to the plurality of split requests; and a data processing circuit configured to receive request data corresponding to the first write request, wherein the data processing circuit outputs a first part of the request data when a split command corresponding to the 11th write request is output and the data processing circuit outputs a second part of the request data when a split command corresponding to the 12th write request is output.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate various embodiments, and explain various principles and advantages of those embodiments.

DETAILED DESCRIPTION

The following detailed description references the accompanying figures in describing illustrative embodiments consistent with this disclosure. The embodiments are provided for illustrative purposes and are not exhaustive. Additional embodiments not explicitly illustrated or described are possible. Further, modifications can be made to presented embodiments within the scope of the present teachings. The detailed description is not meant to limit this disclosure. Rather, the scope of the present disclosure is defined in accordance with claims and equivalents thereof. Also, throughout the specification, reference to "an embodiment" or the like is not necessarily to only one embodiment, and different references to any such phrase are not necessarily to the same embodiment(s).

Figure 1:
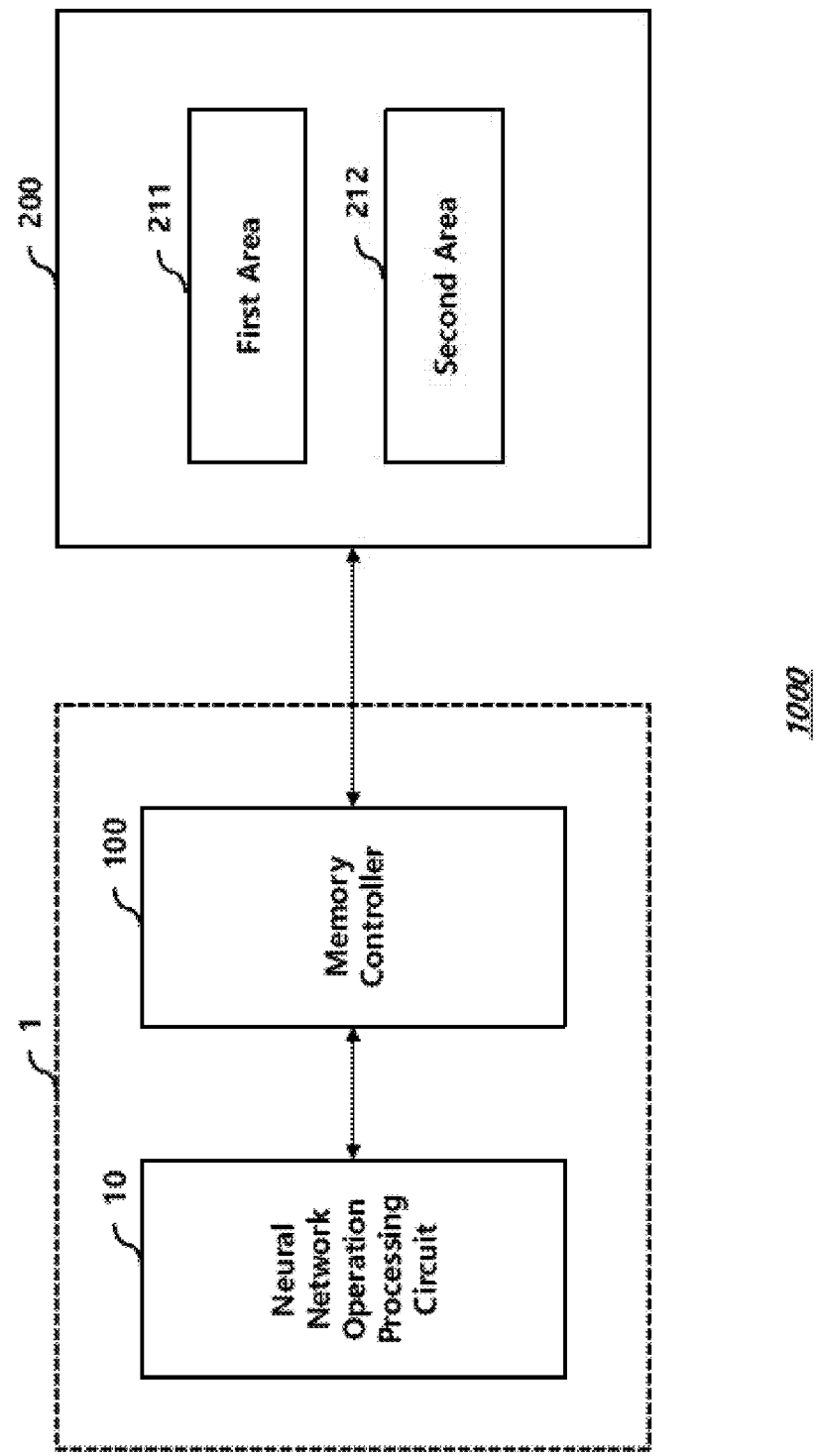
FIG. 1 illustrates a memory system according to an embodiment of the present disclosure.

FIG. 1 is a block diagram of a memory system 1000 according to an embodiment of the present disclosure.

The memory system 1000 includes a host 1 and a memory device 200.

The host 1 includes a neural network operation processing circuit 10 that generates a read/write request for neural network data necessary for neural network operations while processing the neural network operations. The host 1 also includes a memory controller 100 that controls the memory device 200.

The neural network operation processing circuit 10 may include software, hardware, or a combination of software and hardware.

For example, the neural network operation processing circuit 10 may include software for controlling neural network operations and a central processing unit (CPU) being driven by the software.

The neural network operation processing circuit 10 generates a read or write request for neural network data used for neural network operations.

The neural network data may include input data for neural network operations, intermediate data generated during the neural network operations, output data produced as a result of the neural network operations, or combinations thereof.

The memory controller 100 receives a read or write request for neural network data and generates a read or write command corresponding to the neural network data, and provides the read or write command to the memory device 200.

The configuration and operation of embodiments of the memory controller 100 will be described in detail below.

In embodiments, the memory device 200 includes a memory device that requires a refresh operation, such as a DRAM.

In the embodiment, the memory device 200 includes a first area 211 and a second area 212.

The refresh period of the second area 212 is set longer than the refresh period of the first area 211. As a result, data stored in the second area 212 may have an increased chance of errors occurring compared to data stored in the first area 211 due to decreased data retention in the second area 212.

In FIG. 1, the first area 211 and the second area 212 may occupy address spaces that are distinct from each other.

In an embodiment, the first area 211 stores data that has relatively greater effect on the accuracy of the neural network operation, and the second area 212 stores data that has relatively smaller effect on the accuracy of the neural network operation.

For example, errors occurring in the upper bits (e.g., the most significant bits) of neural network data generate greater errors in the result of neural network operations, while errors occurring in the lower bits generate relatively smaller errors in the result of neural network operations.

Accordingly, when the neural network data has 32 bits, in the present embodiment, the upper 16 bits of the neural network data may be determined as critical data and stored in the first area 211, and the lower 16 bits may be determined as non-critical data and stored in the second area 212.

Figure 2:
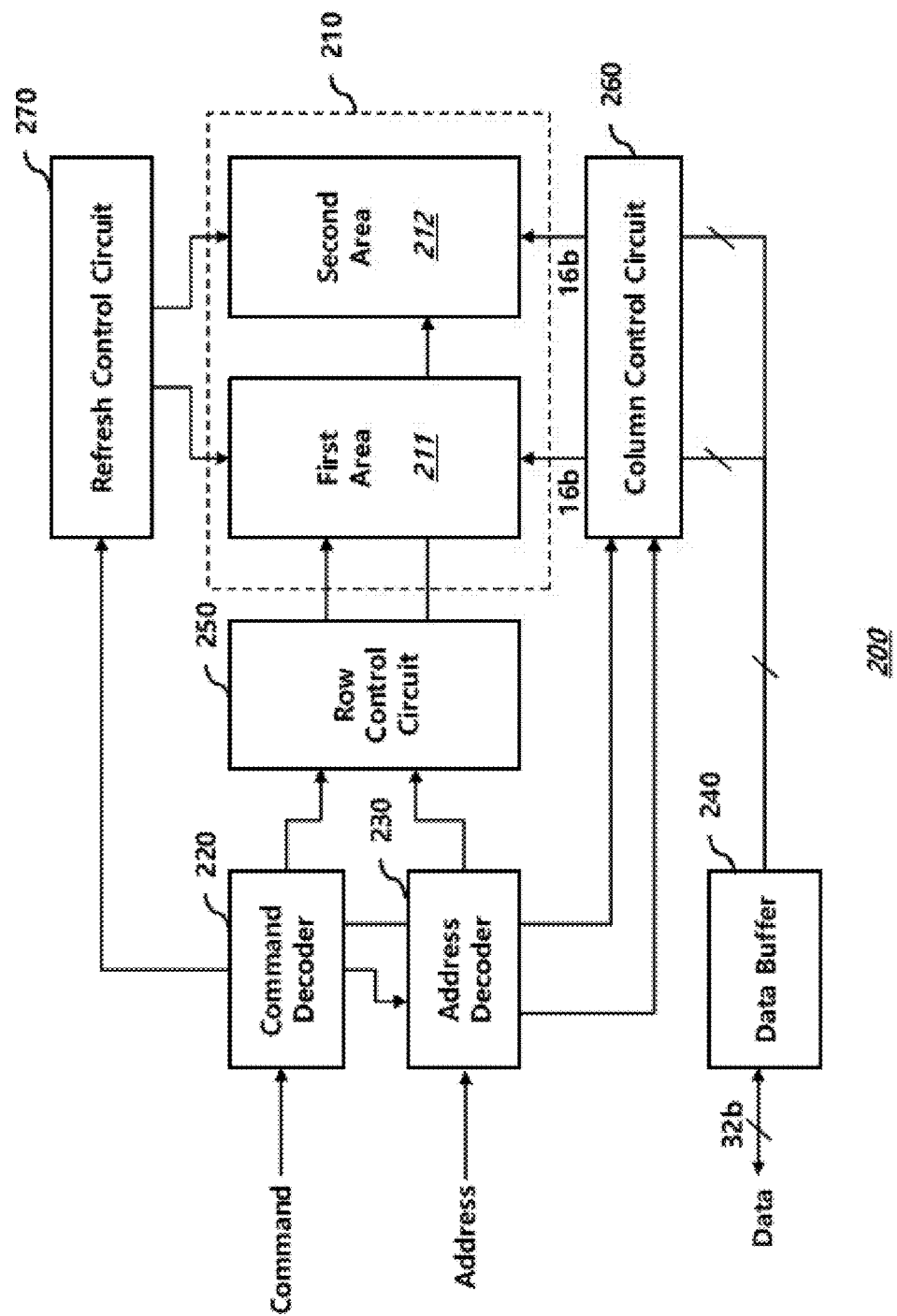
FIG. 2 illustrates a memory device according to an embodiment of the present disclosure.

FIG. 2 is a block diagram illustrating a memory device 200 according to an embodiment of the present disclosure.

In the embodiment of FIG. 2, a memory controller, such as the memory controller 100 of FIG. 1, may provide read and/or write commands to the memory device 200 in the same manner as a general memory controller.

That is, the memory controller 100 does not perform an operation of distinguishing upper data from lower data while processing a read or write request for neural network data.

To process a write command provided from the memory controller 100, the memory device 200 stores a first part of the data provided by the memory controller 100 in the first area 211 and stores a second part of the data in the second area 212.

In addition, the memory device 200 processes a read command provided from the memory controller 100 by combining a first part of data read in the first area 211 and a second part of data read in the second area 212 to provide a combined data of the first part and the second part to a memory controller 100.

The memory device 200 includes a cell array 210, a command decoder 220, an address decoder 230, a data buffer 240, a row control circuit 250, a column control circuit 260 and a refresh control circuit 270.

The cell array 210 includes a first area 211 and a second area 212.

The refresh period of the second area 212 is set longer than the refresh period of the first area 211.

In this embodiment, the data requested to be written is split into two parts and stored in the first area 211 and the second area 212, respectively, but embodiments are not limited thereto.

In another embodiment, a cell array may be split into three or more areas, and data requested to be written may also be split into a corresponding number of parts to be stored in corresponding areas. The detailed description thereof is omitted in the interest of brevity.

In an embodiment, the first area 211 and the second are 212 may have the same size and operate independently of each other.

For example, the first area 211 and the second are 210 may have the same number of rows and the same number of columns.

In an embodiment, when a width of the data is 32 bits, the first area 211 may be used to store an upper 16 bits of the data and the second area 212 may be used to store a lower 16 bits of the data.

The command decoder 220 controls the address decoder 230, the row control circuit 250, and the column control circuit 260 according to a command provided from the memory controller 100.

The address decoder 230 identifies a row address and a column address from an address provided from the memory controller 100, provides the row address to the row control circuit 250, and provides the column address to the column control circuit 260.

In an embodiment, the row control circuit 250 may control the first area 211 and the second area 212 using the same row address.

In addition, the column control circuit 260 controls the first area 211 using a first column address for inputting and outputting the upper 16 bits and the second area 212 using a second column address for inputting and outputting the lower 16 bits.

The refresh control circuit 270 controls the refresh operation of the first area 211 and the second area 212 according to the respective refresh periods for each area.

As described above, the refresh period of the second area 212 is set longer than that of the first area 211.

Since a technique for controlling a refresh operation according to a predetermined period in a memory device such as a DRAM is well known, a detailed description of the refresh control circuit 270 is omitted.

The data buffer 250 buffers data used for reading and writing operations.

When a write command is processed, the data buffer 250 may receive 32-bit write data and may provide the upper 16 bits of the received data to the first area 211 and the lower 16 bits of the received data to the second area 212.

When a read command is processed, the data buffer 250 merges the upper 16-bit data provided from the first area 211 with the lower 16-bit data provided from the second area 212 to produce 32-bit data and then transmits the 32-bit data to the memory controller 100. The upper 16-bit data may be represented as the upper data and the lower 16-bit data may be represented as the lower data.

As described above, in the embodiment of FIG. 2, data is split into upper data and lower data in the memory device 200 even though the memory controller 100 does not provide separate read or write commands for the upper data or for the lower data.

In another embodiment described hereinafter, when the memory controller 100 processes the read or write data, the memory controller 100 generates a read or write command for upper data and a read or write command for lower data and provides them to the memory device 200.

Accordingly, in the following embodiment, the memory device 200 stores data in response to commands and addresses provided from the memory controller 100 as a conventional memory device does and does not classify data into upper data or lower data.

But the memory device 200 still includes the first area 211 and the second area 212.

In this embodiment, the memory controller 100 may control the first area 211 and the second area 212 to be refreshed with different refresh periods.

However, during the read or write operation, splitting and merging data is not performed in the memory device 200, which is not different from that of the conventional memory device 200.

The physical address range of the first area 211 and the physical address range of the second area 212 may both be known to the memory controller 100.

Figure 3:
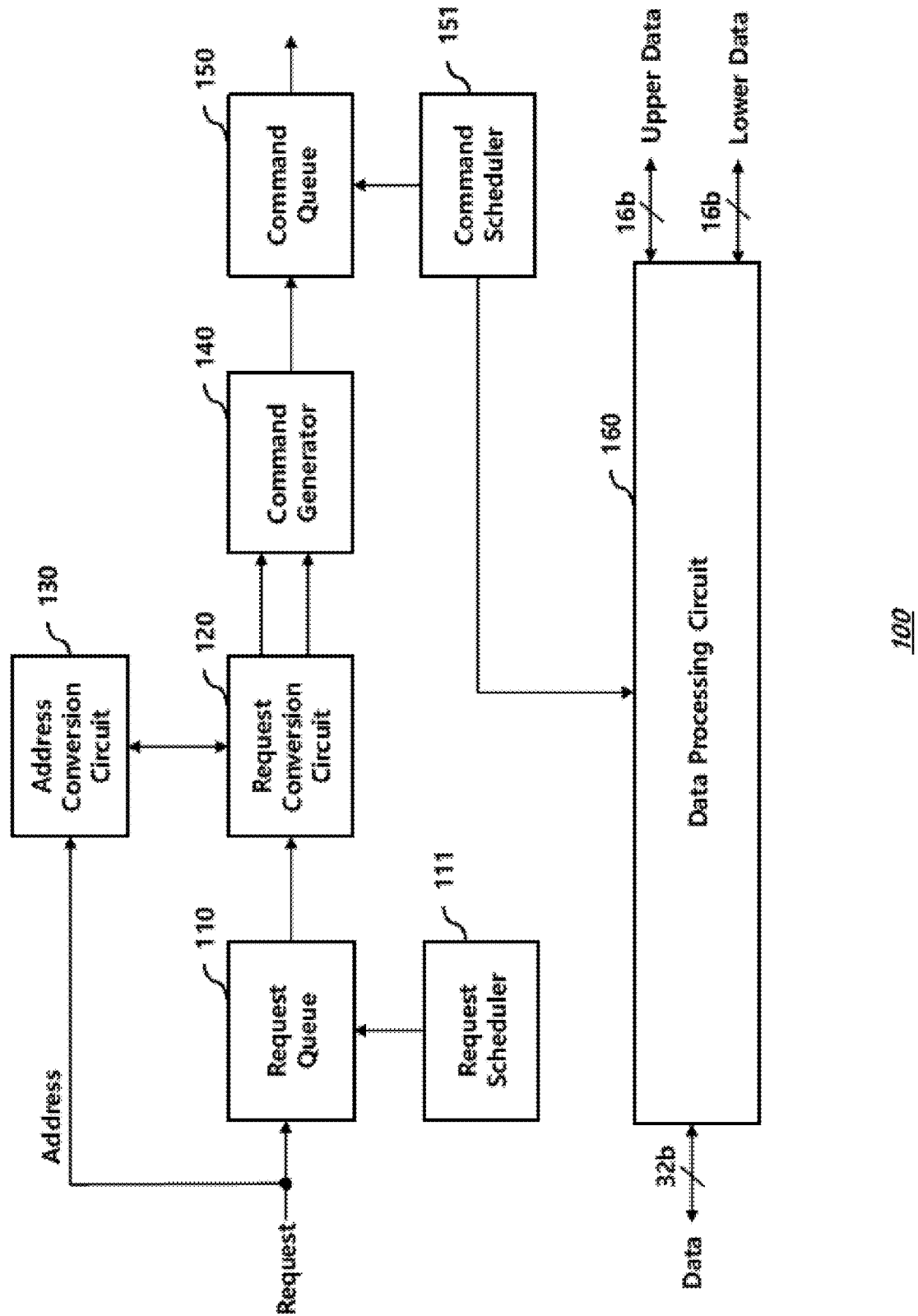
FIG. 3 illustrates a memory controller according to an embodiment of the present disclosure.

FIG. 3 is a block diagram of a memory controller 100 according to such an embodiment of the present disclosure.

The memory controller 100 includes a request queue 110, a request conversion circuit 120, an address conversion circuit 130, a command generator 140, a command queue 150, a request scheduler 111, and a command scheduler 151.

The memory controller 100 further includes a data processing circuit 160.

The request queue 110 receives and stores a read or write request which may be provided by the neural network operation processing circuit 10 of FIG. 1.

Hereinafter, a read or write request input to the request buffer 110 is referred to as a memory request.

The memory request is not limited to read and write requests, and may further include other requests that perform read or write operations while processing the request.

The data provided with a write request, which may be neural network data in the embodiment, is stored in the data processing circuit 160.

In this illustrative embodiment, it is assumed that a width of data requested by a memory request is 32 bits, but embodiments are not limited thereto.

The request scheduler 111 determines a processing order of requests stored in the request queue 110. Since the operation of the request scheduler 111 is well known, detailed description thereof is omitted.

The request conversion circuit 120 generates a first request for upper 16-bit data, that is, upper data, and a second request for lower 16-bit data, or lower data, from the memory request.

For example, in response to a write request, a first write request for upper data and a second write request for lower data are generated, and in response to a read request, a first read request for upper data and a second read request for lower data are generated.

The address conversion circuit 120 converts a logical address corresponding to a memory request into a physical address. At this time, a first physical address corresponding to the first request and a second physical address corresponding to the second request may be determined according to a predetermined rule.

As described above, address range that the first address can have, that is, the address range of the first area 211, and address range that the second address can have, that is, the address range of the second area 212, may be provided to the memory controller 100 in advance.

Since an operation of a conventional memory controller converting a logical address into a physical address itself is well known, a detailed disclosure thereof is omitted.

The command generator 140 generates a first command and a second command corresponding to the first request and the second request and provides the first command and the second command to the command queue 150.

The command scheduler 151 transmits a command selected from the command queue 150 to a memory device 200 in consideration of conditions such as timing conditions.

For example, the command queue 150 may sequentially output a first write command and a second write command, and the data processing circuit 160 may transmit upper data and lower data respectively corresponding to the first write command and the second write command.

The processing of a read request can be similarly performed, as described below.

The request conversion circuit 120 converts the read request into a first read request and a second read request, and provides them to the command generator 140. The command generator 140 generates a first read command and a second read command corresponding to the first read request and the second read request and provides the first read command and the second read command to the command queue 150.

When the first read command corresponding to the first read request is provided to the memory device 200, upper data output from the memory device 200 is stored in the data processing circuit 160, and when the second read command corresponding to the second read request is provided to the memory device 200, lower data output from the memory device 200 is stored in the data processing circuit 160.

Thereafter, the data processing circuit 160 may combine the upper data and the lower data into 32-bit data and provide the 32-bit data to the neural network operation processing circuit 10.

Figure 4:
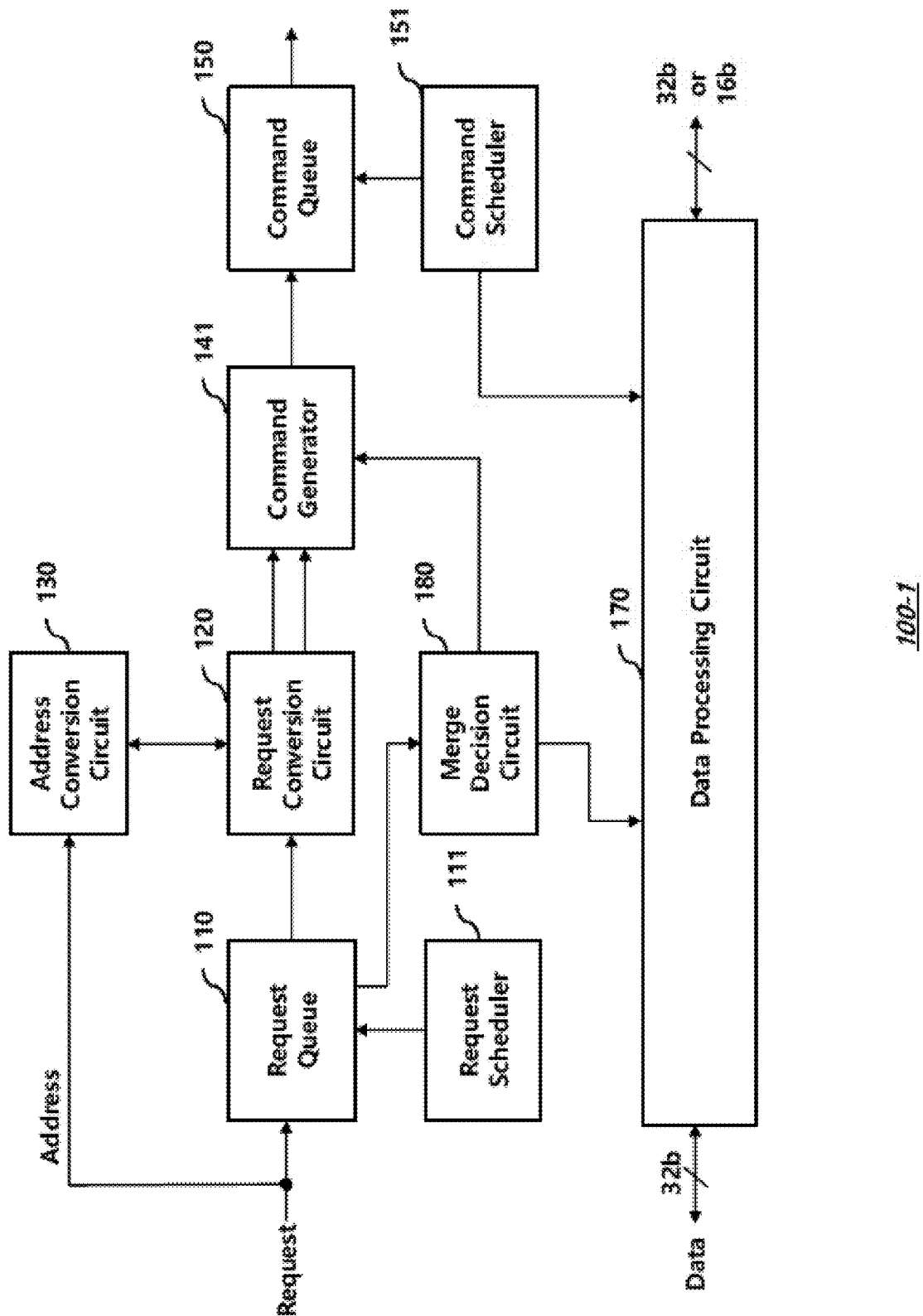
FIG. 4 illustrates a memory controller according to an embodiment of the present disclosure.

FIG. 4 is a block diagram illustrating a memory controller 100-1 according to another embodiment of the present disclosure.

In the embodiment of FIG. 3, the memory controller 100 splits one request into two requests and processes the two requests. That is, a request for one 32-bit data is split into two requests for respective 16-bit data. The two request generated by the splitting may be referred to as split requests.

In the embodiment of FIG. 4, the memory controller 100-1 merges two split requests for 16-bit data (which split requests may have been respectively produced from different requests for 32-bit data) to generate a request for 32-bit data and process the request for 32-bit data, thereby preventing a slowdown. The request for 32-bit data generated by the merger may be referred to as a merged request.

In the embodiment of FIG. 4, the memory controller 100-1 includes a request queue 110, a request conversion circuit 120, an address conversion circuit 130, a command generator 141, a command queue 150, and a request scheduler 112, a command scheduler 152 and a data processing circuit 170.

The operation of the request queue 110, the request scheduler 111, the request conversion unit 120, the address conversion unit 130, the command queue 150, and the command scheduler 151 is substantially the same as the embodiment of FIG. 3. Therefore, descriptions thereof are not repeated.

The memory controller 100-1 further includes a merge decision circuit 180.

The merge decision circuit 180 determines whether there are memory requests for consecutive addresses in the request queue 110.

Whether there are memory requests for consecutive addresses can be determined within a predetermined time window.

For example, the request queue 110 may have a predetermined storage space for storing a plurality of requests inputted in the order of time.

Accordingly, when a request having an address is output from the request queue 110, it is possible to determine whether another request having a consecutive address exists in the request queue 110.

When it is determined that there is no request having a consecutive address, as described in the embodiment of FIG. 3, split requests for 16-bit data are sequentially output.

When there are two memory requests for 32-bit data having consecutive addresses, the command generator 141 generates two merged commands from the four split requests corresponding to the two memory requests.

For example, when there are two write requests for 32-bit data that have consecutive addresses, the data processing circuit 170 merges four 16-bit data corresponding to four split requests (derived from the two write request for 32-bit data) to generate two 32-bit data corresponding to two merged commands.

The two merged commands are stored in the command queue 150 and output to the memory device 200 under the control of the command scheduler 151.

Figure 5:
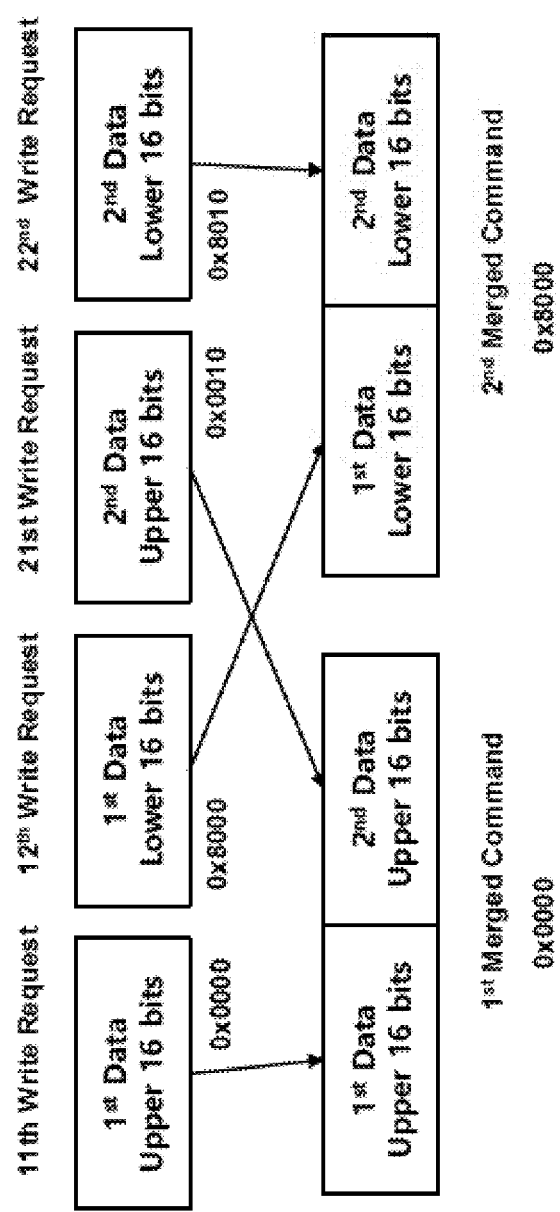
FIG. 5 illustrates a data splitting operation according to an embodiment of the present disclosure.

FIG. 5 is a diagram illustrating an operation of generating two merged commands from four split requests and an operation of generating 32-bit data corresponding to the merged commands.

In FIG. 5, the split requests and corresponding split commands are write requests and write commands, but embodiments are not limited thereto.

In the example shown in FIG. 5, the $11^{th}$ write request is a split write request to store the upper 16 bits of the first data at the physical address 0x0000.

In the example, the $12^{th}$ write request is a split write request to store the lower 16 bits of the first data at the physical address 0x8000.

In the example, the $21^{st}$ write request is a split write request to store the upper 16 bits of the second data at the physical address 0x0010.

In the example, the $22^{nd}$ write request is a split write request to store the lower 16 bits of the second data at the physical address 0x8010.

The first merged command is a merged command for writing 32-bit data generated by merging the upper 16 bits of the first data and the upper 16 bits of the second data at the physical address 0x0000.

The second merged command is a merged command for writing 32-bit data generated by merging the lower 16 bits of the first data and the lower 16 bits of the second data at the physical address 0x8000.

As described above, the processing speed of the embodiment of FIG. 4 can be improved as compared to the embodiment of FIG. 3 in that four split requests for consecutive addresses are processed by two merge commands.

The embodiment of FIG. 4 can prevent performance degradation when an application frequently accesses data of consecutive addresses.

The command signal output from the command queue may be encoded to include a signal indicating whether it is a merged command or not.

At this time, the command decoder of the memory device 200 may perform a decoding operation according to an encoding criterion of the memory controller to identify whether a receive command is a merged command or not.

Other interface rules may be applied to distinguish split commands from merged commands, which are variously implemented by a person skilled in the art with reference to the present disclosure and therefore detailed disclosure thereof is omitted.

Although various embodiments have been illustrated and described, various changes and modifications may be made to the described embodiments without departing from the spirit and scope of the invention as defined by the following claims.

What is claimed is:

1. A memory system comprising:
a memory device including a first area being refreshed according to a first refresh period and a second area begin refreshed according to a second refresh period longer than the first refresh period; and
a memory controller configured to generate a write command and write data corresponding to a first write request and first data,
wherein first data corresponding to a first part of the write data is stored in the first area and second data corresponding a second part of the write data is stored in the second area, and
wherein the memory controller splits the first write request into a 11th write request and a 12th write request, generates a 11th write command corresponding to the 11th write request and a 12th write command corresponding to the 12th write request to provide the 11th write command and the 12th write command to the memory device, wherein the first data corresponds to the 11th write command the second data corresponds to the 12th write command.

2. The memory system of claim 1, wherein the first data corresponds to upper bits of the write data and the second data corresponds to lower bits of the write data.

3. The memory system of claim 1, wherein when a second write request is for an address consecutive to an address for the first write request, the memory controller splits the second write request into a 21st write request and a 22nd write request, generates a first merged command corresponding to the 11th write request and the $21^{st}$ write request and a second merged command corresponding to the $12^{th}$ write request and the 22nd write request, and provides the first merged command and the second merged command to the memory device.

4. The memory system of claim 1, further comprising a neural network operation processing circuit providing the first write request and the first write data to the memory controller.

* * * * *